United States Patent [19]

Huebner

[11] Patent Number: 5,474,651

[45] Date of Patent: Dec. 12, 1995

[54] METHOD FOR FILLING VIA HOLES IN A SEMICONDUCTOR LAYER STRUCTURE

[75] Inventor: Holger Huebner, Baldham, Germany

[73] Assignee: Siemens Aktiengesellschaft, Munich, Germany

[21] Appl. No.: 289,264

[22] Filed: Aug. 11, 1994

[30] Foreign Application Priority Data

Sep. 14, 1993 [DE] Germany .......................... 43 31 185.7

[51] Int. Cl.$^6$ ...................................... B44C 1/22
[52] U.S. Cl. .................. 156/644.1; 156/649.1; 216/17; 216/18; 216/19; 216/39; 437/228; 437/203
[58] Field of Search ................... 437/228, 203; 156/644, 644.1, 649.1; 216/17, 18, 19, 37

[56] References Cited

U.S. PATENT DOCUMENTS 4,888,087  12/1989  Moslehi et al. .................. 156/644

FOREIGN PATENT DOCUMENTS

0517551A2  12/1992  European Pat. Off. ...... H01L 21/321

OTHER PUBLICATIONS

Three–Dimensional ICs Project (Fiscal 1981–1990), Research and Development Assocation for Future Electron Devices, F.E.D., Tokyo, 1991, Chapter 2.1.

J. Electrochem. Soc., vol. 136, No. 1, Jan., 1989; The Electro–Chemical Society, Inc.; Edward K. Yung et al "Plating of Copper Into Through–Holes and Vias", pp. 206–215.

Primary Examiner—Charles L. Bowers, Jr.
Assistant Examiner—Mark F. Huff
Attorney, Agent, or Firm—Hill, Steadman & Simpson

[57] ABSTRACT

For filling via holes that extend onto interconnects to be contacted in a semiconductor layer structure, the interconnects are connected to a conductive layer through auxiliary via holes. The via holes are filled with metal by electrodeposition, whereby the interconnects are wired as a cooperating electrode in an electrolyte via an auxiliary contact to the conductive layer. Subsequently, the conductive layer is removed.

11 Claims, 2 Drawing Sheets

METHOD FOR FILLING VIA HOLES IN A SEMICONDUCTOR LAYER STRUCTURE

BACKGROUND OF THE INVENTION

Via holes that extend onto the corresponding interconnect are opened in a semiconductor layer structure for contacting interconnects. It is all the more important that the filling of the via holes occurs in void-free fashion the smaller the cross section of the via holes becomes as a consequence of increasing miniaturization. A non-uniform filling of the via holes leads to a deterioration of the contact resistance.

A further increase in the packing density and a shortening of the connecting paths in semiconductor circuits is achieved by cubic integration. In cubic integration, semiconductor layer structures that contain the respective integrated circuit are respectively ground thin to a few 10 µm and are arranged as a stack. The different semiconductor levels can thereby be composed of different substrate materials and/or can be fabricated in different technologies. Contacts must be formed through the semiconductor layer structures in a vertical direction. Such a component stack looks like a new semiconductor module viewed from the outside. It can be realized in a standard housing with a reduced number of connections, even though it comprises enhanced functionality.

The contacts between neighboring levels in cubic integration likewise occur via metal-filled via holes. The problem of void-free filling of via holes also arises here. Three-Dimensional ICs Project (Fiscal 1981–1990), Research and Development Association for Future Electron Devices, F.E.D., Tokyo, 1991, Chapter 2.1, incorporated herein, discloses a method with which vertical contacts between semiconductor layer structures arranged above one another in a stack can be realized. In the known method, tungsten pins having a cross section of approximately 3×3 µm$^2$ are formed on the upper side of a lower semiconductor layer structure. These tungsten pins project 1–2 µm above the upper side of the lower semiconductor layer structure. Large-area depressions, which comprise a dimension of approximately 20×20 µm$^2$ are produced at a corresponding location of the underside of an immediately neighboring, upper semiconductor layer structure and are filled with an Au/In alloy. When the upper semiconductor layer structure and the lower semiconductor layer structure are stacked on top of one another, the tungsten pins immerse into these filled depressions. They are soldered at 300° to 400° C. For compensating surface topographies and in order to produce an additional mechanical connection between two semiconductor layer structures, the surfaces that meet one another are each respectively provided with a polyamide layer as an adhesive.

The thin tungsten pins must be deposited at extremely high temperatures. This leads to high stresses attacking in punctiform fashion in the corresponding semiconductor layer structure. In particular, stress cracks can thereby arise, particularly given stress-sensitive substrate materials such as GaAs or InP.

SUMMARY OF THE INVENTION

It is an object of the invention to specify a method for filling via holes in a semiconductor layer structure, whereby the via holes are filled in void-free fashion with metal and whereby mechanical stresses in the semiconductor layer structure are avoided.

According to the method of the invention for filling at least one via hole in a semiconductor layer structure, at least one auxiliary via hole in which a surface of a first interconnect is uncovered is opened in a first surface of the semiconductor layer structure. A conductive layer that comprises an essentially conformal edge coverage is applied in surface-wide fashion. An insulating layer that has a planarizing effect at least in a region of the auxiliary via hole and that fills the auxiliary via hole is applied onto the conductive layer. The via hole is opened in which the surface of the first interconnect is uncovered. The side walls of the via hole are covered with an insulation structure. An auxiliary contact to the conductive layer is produced outside the via hole. The via hole is filled with metal by electro-deposition in an electrolyte, whereby the first interconnect is connected as a cooperating electrode via the auxiliary contact to the conductive layer.

The employment of electro-deposited layers for contacting is in fact known from E. K. Yung et al, Electrochem. Soc., Vol. 136, No. 1, 1989, pages 206–215, incorporated herein, in conjunction with the manufacture of printed circuit boards. The problem of a complete filling of via holes, however, does not thereby occur since only the edges of the via holes are metallized in the manufacture of printed circuit boards. The filling with metal here occurs in a later soldering by moistening with a solder.

In the method of the invention, by contrast, the sidewall of the via hole is covered with an insulation structure. The interconnect to be contacted which forms the floor of the via hole is used as an electrode in the electro-deposition. As a result thereof, the metal in the electro-deposition grows proceeding from the floor of the via hole. The deposition occurs in practice only in the region of the floor of the via hole. No deposition occurs at the sidewalls. A metal layer that ultimately fills the via hole grows in void-free fashion in the via hole.

After the electro-deposition, the conductive layer and the insulating layer arranged thereabove are removed by planarizing the surface of the semiconductor layer structure. The auxiliary via hole thereby remains filled with parts of the conductive layer and of the insulating layer. The formation of a cavity by the auxiliary via hole during the course of further processing wherein corrosive process agents could possibly collect is thereby avoided.

The method of the invention is suitable for simultaneously filling a multitude of via holes by electro-deposition. In this case, auxiliary via holes are opened to all interconnects to be contacted, these being shorted via the conductive layer.

The method of the invention is likewise suitable for simultaneously filling via holes at the upper side and at the underside of a semiconductor layer structure by electro-deposition. In this case, a further conductive layer is generated at the underside, this further conductive layer being in contact through auxiliary via holes with the interconnects to be contacted. Both conductive layers are connected as a cooperating electrode in the deposition.

It is especially advantageous to connect the interconnects to ground potential via the conductive layer in the electro-deposition since it is assured in this way that electrical currents and voltages during the electro-deposition do not cause any damage to active structures of the semiconductor layer structure that are in contact with the interconnects. In particular, electrostatic charges that could lead to punctures in the gate oxide are avoided.

DESCRIPTION OF THE PREFERRED EMBODIMENTS

Figure 1:
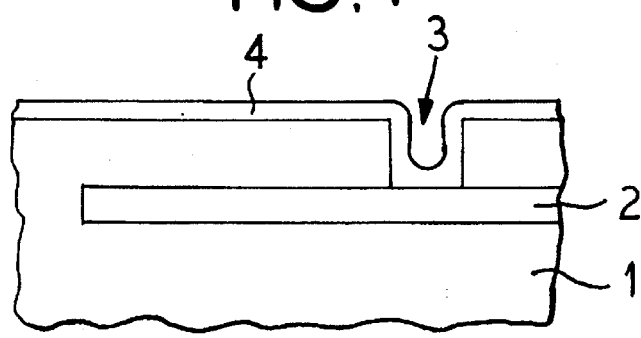
FIG. 1 shows a semiconductor layer structure having an interconnect, having an auxiliary via hole and having a conductive layer.

A semiconductor layer structure 1 comprises at least one interconnect 2 (see FIG. 1). For example, the semiconductor layer structure 1 is a semiconductor wafer of single-crystal silicon or a III-V semiconductor. The semiconductor layer structure 1 comprises circuit structures that are component parts of a micro-electronic circuit, or of an opto-electronic component, or of a sensor component. The interconnect 2 is connected to at least one circuit structure.

An auxiliary via hole 3 is produced in the semiconductor layer structure 1. The auxiliary via hole 3 extends to the surface of the interconnect 2. For example, the auxiliary via hole 3 is generated in a dry-etching process upon employment of a photoresist mask. Subsequently, the photoresist mask is in turn removed. The auxiliary via hole 3 can be arranged at any desired location outside the position of the via holes to be produced later.

Subsequently, a conductive layer 4 is applied in surface-wide fashion. The conductive layer 4 is in contact with the interconnect 2 in the region of the auxiliary via hole 3. The conductive layer 4 is deposited with an essentially conforming edge coverage. For example, the conductive layer 4 is produced of tungsten in a CVD deposition or is produced of gold in a current-less deposition.

Figure 2:
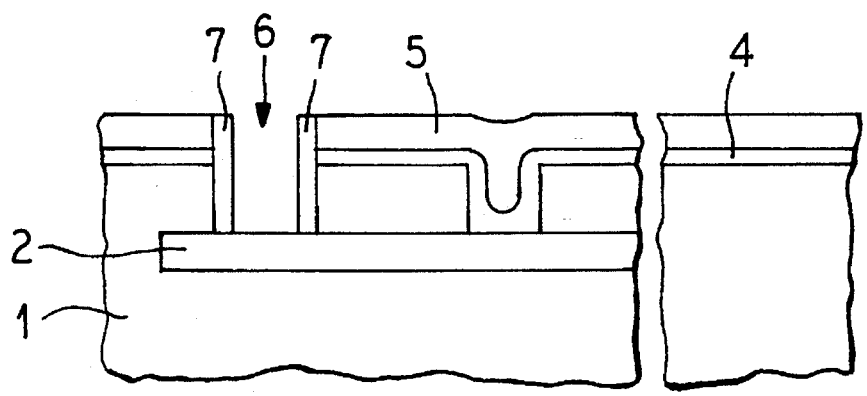
FIG. 2 shows the semiconductor layer structure having a via hole to be filled, the sidewall thereof being provided with an insulation structure.

A photoresist layer 5 that fills the auxiliary via hole 3 is applied in surface-wide fashion. A photoresist layer 5 is exposed and developed. A via hole 6 for contacting the interconnect 2 is produced with the assistance of a dry-etching process (see FIG. 2). The surface of the interconnect 2 is uncovered in the region of the via hole 6.

A conforming insulating layer of, for example, $SiO_2$ or $Si_3N_4$ is deposited. The insulating layer is removed from horizontal surfaces in a dry-etching, so that an insulation structure 7 arises. In the form of a spacer, the insulation structure 7 covers only the sidewall of the via hole 6. The insulation structure 7 insulates the interior of the via hole 6 from the conductive layer 4. The surface of the interconnect 2 in the region of the via hole 6 is covered by the insulation structure 7 only at the edge of the via hole 6, and is uncovered in its remaining area.

Figure 3:
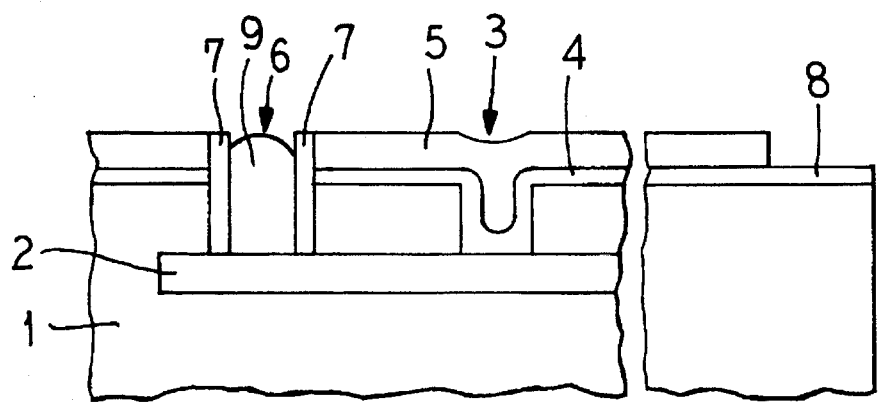
FIG. 3 shows the semiconductor layer structure with the electro-deposition of a metal layer in the via hole.

The photoresist layer 5, for example, is removed at the edge of the semiconductor layer structure I with an edge delacquering. As a result thereof, the surface of the conductive layer 4 is uncovered at the edge of the semiconductor layer structure 1. The uncovered part of the conductive layer 4 forms an auxiliary contact 8 (see FIG. 3).

The auxiliary contact 8 is preferably connected to ground potential. The semiconductor layer structure 1 is introduced into an electrolyte suitable for an electro-deposition. Gold cyanide is particularly suited as an electrolyte. A potential of a few volts, for example 1 through 5 volts, is applied between the interconnect 2, acting as a cathode in the electro-deposition, and an anode that is likewise situated in the electrolyte. The potential is defined dependent on the size of the uncovered surface and on the conductivity of the electrolyte. A metal layer 9 of, for example copper, is deposited on the uncovered surface of the interconnect 2 by electro-deposition. The metal layer 9 fills the entire via hole 6 in void-free fashion.

Subsequently, the photoresist layer 5 is removed with solvents. The conductive layer 4 is essentially removed by repolishing the surface of the semiconductor layer structure 1. Residues of the conductive layer 4 and of the photoresist layer 5 thereby remain in the auxiliary via hole 3. The size of the remaining residue of the conductive layer 4 is so slight that no stray capacitances that could deteriorate the function of the circuit need thereby be feared. The residue of the photoresist layer 5 which remains in the auxiliary via hole 3 prevents a cavity from forming in this region in the course of further processing, corrosive process agents being capable of possibly collecting in this cavity.

Figure 4:
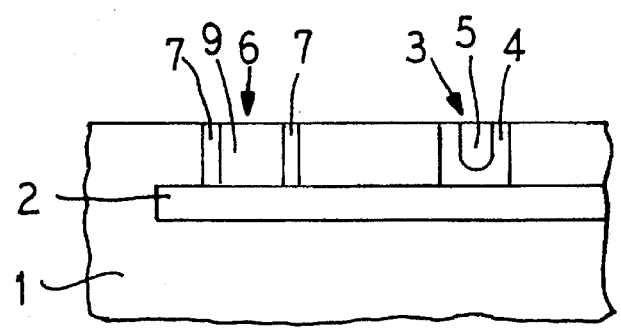
FIG. 4 shows the semiconductor layer structure after removal of the conductive layer and after planarization of the surface.

The semiconductor layer structure 1 (see FIG. 4) comprises a planar surface in the region of the via hole 6.

Figure 5:
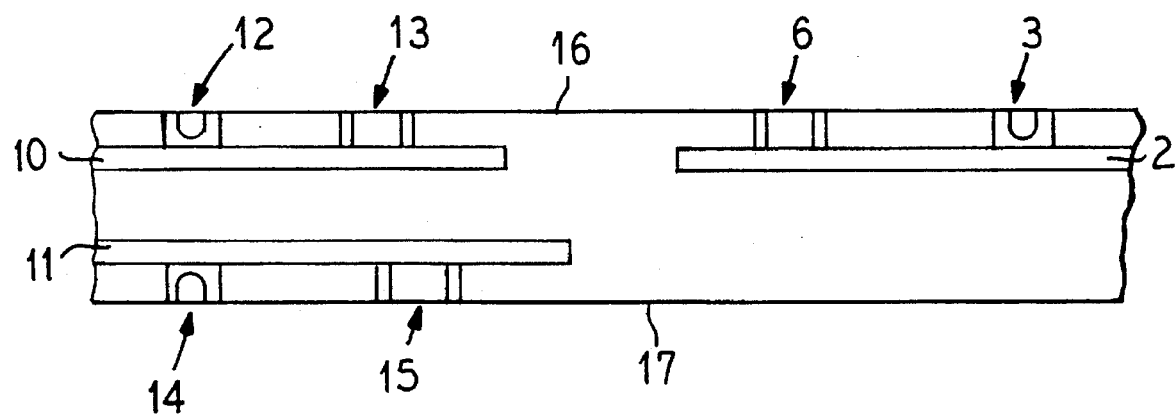
FIG. 5 shows the semiconductor layer structure having a plurality of interconnects with via holes extending towards the interconnects from opposite surfaces of the structure.

In the exemplary embodiment shown in FIGS. 1–4, only one interconnect, one via hole and one auxiliary hole have been shown for the sake of clarity. In practice, a semiconductor layer structure comprises a multitude of interconnects, each of which is to be respectively contacted through via holes. In this case, as shown in FIG. 5, each interconnect 2, 10, and 11 is connected to the conductive layer via at least one auxiliary via hole 3, 12, or 14. The via holes 6, 13, or 15 to be filled are each respectively provided with an insulation structure at their sidewalls as explained in relation to FIGS. 1–4. In the electro-deposition, all interconnects 2, 10, and 11 that are in communication with the conductive layer are then connected as a cathode via one or more auxiliary contacts such as shown at 8 in FIG. 3 for a single interconnect.

When the semiconductor layer structure is to be wired in a cubic integration, then auxiliary via holes, each of which respectively extends onto an interconnect to be contacted, are opened at opposite surfaces of the semiconductor layer structure, also as shown in FIG. 5. Conductive layers that short the interconnects with one another are applied onto both surfaces. Subsequently, via holes 6, 13, and 15 are opened analogous to the exemplary embodiment set forth with reference to FIGS. 1–4 and are provided with insulation structures. Both conductive layers are connected as a cathode in the electro-deposition. The via holes 6, 13 and 15 at both opposite surfaces 16 and 17 are filled in this way in one process. Subsequently, the photoresist layer and the conductive layer on both surfaces 16 and 17 are removed with the assistance of planarizing methods, for example polishing.

Although various minor changes and modifications might be suggested by those skilled in the art, it will be understood that I wish to include within the claims of the patent warranted hereon all such changes and modifications as reasonably come within my contribution to the art.

I claim as my invention:

1. A method for filling at least one via hole in a semiconductor layer structure having an interconnect therein spaced from a first surface of the semiconductor layer structure, comprising the steps of:

opening at least a first auxiliary via hole in said semiconductor layer structure from said first surface down to said interconnect so as to uncover a portion of said interconnect;

applying a conductive layer having conforming edge coverage on said first surface and into said first auxiliary via hole so as to contact the uncovered portion of the interconnect;

applying an insulating layer onto said conductive layer so as to fill the first auxiliary via hole;

providing an opening through said insulating layer and conductive layer, and through said semiconductor layer structure from said first surface down to said interconnect so as to uncover another portion of said interconnect and form a first via hole thereto;

covering sidewalls of the first via hole with an insulation structure;

utilizing a portion of said conductive layer on said first surface of said semiconductor layer structure as an auxiliary contact;

providing an electrolyte, immersing the semiconductor layer structure in the electrolyte, and connecting a power source for an electro-deposition between the electrolyte and said first interconnect by utilizing the auxiliary contact which is in electrical connection with said first interconnect via said conductive layer passing through said first auxiliary via hole;

filling said first via hole with metal by electro-deposition in the electrolyte; and removing the insulating layer and conductive layer lying above the first surface of the semiconductor layer structure.

2. A method according to claim 1 wherein the auxiliary contact to the conductive layer is connected to ground potential during the electro-deposition.

3. A method according to claim 1 including the steps of:

providing in said semiconductor layer structure a second interconnect spaced from said first surface;

opening at least a second auxiliary via hole from said first surface down to said second interconnect before application of said conductive layer;

when applying said conductive layer in said first auxiliary via hole, also applying said conductive layer in said second auxiliary via hole so that the first and second interconnects are electrically shorted via the conductive layer;

opening a second via hole from said first surface down to said second interconnect before said electro-deposition;

covering sidewalls of said second via hole with a further insulation structure; and also filling said second via hole with metal during said electro-deposition.

4. A method according to claim 1 including the further steps of:

forming said insulating layer in said first auxiliary via hole as a photoresist which also covers portions of said conductive layer overlying said first surface of said semiconductor layer structure; and after exposure and development of said insulating layer of photoresist, employing the photoresist as an etching mask for opening said first via hole with the assistance of an anisotropic dry-etching process.

5. A method according to claim 4 wherein an edge delacquering is implemented producing said auxiliary contact to the conductive layer.

6. A method according to claim 1 including the step of forming said conductive layer of tungsten in a CVD deposition.

7. A method according to claim 1 including the step of forming said conductive layer of gold in a current-less deposition.

8. A method according to claim 1 including the step of forming the insulation structure at the sidewalls of the first via hole by surface-wide deposition of an insulation layer which is substantially edge conforming followed by an anisotropic etching of the insulation layer.

9. A method according to claim 1 wherein a second surface via hole is filled at a second surface of the semiconductor substrate which lies opposite the first surface, and includes the steps of:

opening a second surface auxiliary via hole from said second surface and extending to a surface of an interconnect to be contacted from said second surface;

applying a further conductive layer onto the second surface and into said second surface auxiliary via hole at said second surface;

applying a further insulating layer onto said further conductive layer which fills the second surface auxiliary via hole at tile second surface;

opening a second surface via hole from said second surface to said further interconnect;

covering sidewalls of the second surface via hole with an insulating structure;

providing a contact to the further conductive layer; and filling the second surface via hole with metal by said electro-deposition in said electrolyte when filling the first via hole at tile first surface.

10. A method according to claim 9 wherein the contact of the further conductive layer is connected to ground potential during the electro-deposition.

11. A method for filling at least one via hole in a semiconductor layer structure having an interconnect therein spaced from a first surface of the semiconductor layer structure, comprising the steps of:

opening at least one auxiliary via hole from said first surface down to said interconnect so as to uncover a portion of the interconnect;

applying a conductive layer on said first surface and into said auxiliary via hole so as to contact the uncovered portion of the interconnect;

applying an insulating layer onto said conductive layer so as to fill the auxiliary via hole;

providing an opening through said insulating layer, conductive layer and semiconductor layer structure to said interconnect so as to uncover another portion thereof and form a via hole thereto;

covering sidewalls of the via hole with an insulation structure;

utilizing a portion of said conductive layer on said first surface of said semiconductor layer structure as an auxiliary contact;

providing an electrolyte, immersing the semiconductor layer structure in the electrolyte, and connecting a power source for an electro-deposition between the electrolyte and said first interconnect by utilizing the auxiliary contact which is in electrical connection with said first interconnect via said conductive layer passing through said auxiliary via hole;

filling said via hole with metal by electro-deposition in the electrolyte; and stripping off said insulating layer and conductive layer at said first surface and planarizing the first surface of the semiconductor layer structure.

* * * * *